United States Patent [19]

Villano

[11] Patent Number: 4,851,692
[45] Date of Patent: Jul. 25, 1989

[54] CASSETTE IMPROVED TO REDUCE PARTICLE CONTAMINATION OF RETICLES DURING PHOTOLITHOGRAPHIC PROCESSING OPERATIONS

[75] Inventor: Jeffrey P. Villano, San Leandro, Calif.

[73] Assignee: Master Images, Inc., San Jose, Calif.

[21] Appl. No.: 134,636

[22] Filed: Dec. 18, 1987

[51] Int. Cl.$^4$ .............................................. H01L 21/30
[52] U.S. Cl. .............................. 250/492.2; 250/442.1; 378/34
[58] Field of Search ............. 250/492.2, 492.21, 442.1, 250/440.1, 492.1; 378/34

[56] References Cited

U.S. PATENT DOCUMENTS 4,677,042  6/1987  Kato et al. ..................... 378/34
4,738,689  4/1988  Gigl et al. ..................... 57/295

FOREIGN PATENT DOCUMENTS 58-21326  2/1983  Japan ...................... 250/492.2

OTHER PUBLICATIONS

"Some Facts about Electroless Nickel Deposits", Acteron Corporation Fact Sheet, MIL-C-26074.

Primary Examiner—Carolyn E. Fields
Assistant Examiner—John A. Miller
Attorney, Agent, or Firm—Rosenblum, Parish & Bacigalupi

[57] ABSTRACT

A means of improving an E-beam lithography system cassette to reduce wear of contaminating particles from the cassette whereby frictionally engaged surfaces of the cassette are coated and hardened with an electroless deposit of nickel-phosphorous alloy.

3 Claims, 7 Drawing Sheets

CASSETTE IMPROVED TO REDUCE PARTICLE CONTAMINATION OF RETICLES DURING PHOTOLITHOGRAPHIC PROCESSING OPERATIONS

BACKGROUND OF THE INVENTION

1. Field of the Invention

This invention relates generally to electron beam lithography systems, and more specifically to an improvement to cassettes for holding reticles to be written upon by an electron beam system.

2. Prior Art

Electron beam ("E-beam") lithography systems such as the Perkin-Elmer "MEBES" system write an electron beam on blank glass reticles to develop patterns for masks to be used in fabricating integrated circuits. A blank reticle is coated with electron-beam sensitive resist over a layer of chrome and inserted into a cassette, which, together with other cassettes, is loaded into a magazine. From the magazine, cassettes are loaded one at a time onto an X-Y stage under the electron beam in a high vacuum work chamber inside the E-beam system. Each cassette has a V-shaped notch formed in the back face and another in the right side for aligning the cassette against precision alignment pins fixed to the stage. The V-shaped notches have a hard coating to reduce wear which would otherwise affect the dimensional integrity of the cassette.

After a cassette loaded with a reticle is positioned on the stage, an electron beam is scanned rapidly across the blank reticle to expose resist according to a prespecified pattern to write a mask on the reticle. The cassette is then withdrawn from the stage and the reticle is removed from the cassette. The resist is subsequently developed to expose underlying chrome areas to be etched away. Afterwards, there remains a mask negative image which will be transferred repeatedly onto semiconductor substrates to manufacture integrated circuit devices.

Since present day electron beam lighography systems write mask pattern features as small as 0.14 microns, it is apparent that any dust or extraneous particulate matter appearing on the surface of the reticle will adversely affect the resulting mask product. In other words, any particulate matter which deposits on the reticle blank before or during writing is likely to distort features in the pattern being written on the reticle. The smaller the feature size, the smaller the size of particles that it is critical to eliminate from the work chamber and reticle blank.

Although cassettes and recticles are handled and processed under cleanroom conditions, it has been found that (notwithstanding ongoing enhancements), the MEBES system's performance is degraded when reticles are contaminated with particles generated by, and inside of, the system. Since the blank reticle-holding cassettes are made of untreated aluminum, during normal operation of the machine, frictionally contacted cassette surfaces are gradually worn down and the resulting small particles of alumninum are picked up by the guide rollers inside the machine. Referring to FIG. 1, as the roller surfaces become saturated as shown in part 1 of the curve increasing number of particles begin to precipitate onto the reticles, and this correspondingly inreases the rate of mask rejection for particle contamination. Present day E-beam lithography machines rent for around $3,000.00 per hour, and take up to four hours to write some masks. After this amount of writing time, a defect causing a mask to be rejected effectively costs the E-beam system operator around $12,000.00 in lost production time. To reduce the level of particle contamination, approximately every six months (at the end of part 1 of the curve in FIG. 1) E-beam machines must be disassembled and the work chamber opened to clean the cassette loading guide and transport rollers located throughout the loading and work chambers. Barring unforeseen complications, cleaning requires stopping production for a total of approximately 5 days. Furthermore, the E-Beam work chamber, which is normally evacuated to a vacuum of $2 \times 10e-07$ to $10 \times 10e-08$ Torr, contains fragile components susceptible to magnetic fields, which become exposed to the air yet must be kept extremely clean to permit restoration of the high vacuum environment, which requires up to three days. Recalibration requires another two to three days. Although this cleaning procedure reduces the number of particles and corresponding mask rejects to their original levels, and restarts the cycle of particle accumulation, it has been found that even after the machine has been cleaned, some particles remain on the rollers and precipitate out of the rollers at a declining rate as indicated by part 2 of the curve in FIG. 1. At the end of part 2 of the curve, a new accumulation cycle begins and continues through part 3 of the curve. The typical production loss for a given E-beam machine averages 65,000 dollars per year.

SUMMARY OF THE INVENTION

It is therefore an object of this invention to provide a means for substantially reducing the generation of particles which would otherwise contaminate the interiors of E-Beam lighography systems.

According to the present invention, all machine-contacted surfaces of a conventional aluminum cassette are hardened with a thin electroless deposit of high-phosphorus nickel to prevent the generation of aluminum particles which could be picked up by rollers in the E-Beam lithography system.

This invention has the advantage of substantially reducing the need for time consuming and potentially damaging cleaning-servicing of vacuum work chambers inside E-Beam systems, and of reducing the number of otherwise good reticles rejected due to particle contamination. The invention has been found to materially increase E-Beam system up-time and usable product yield rates.

DETAILED DESCRIPTION OF THE PREFERRED EMBODIMENT

Figure 1:
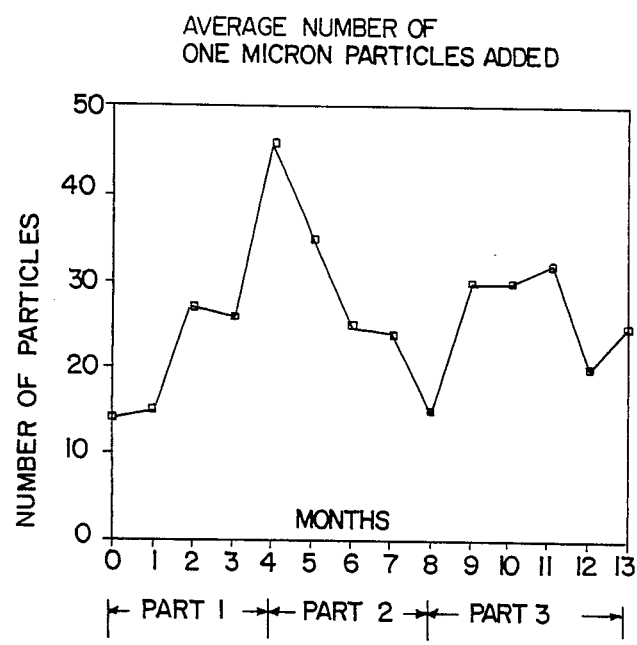
FIG. 1 is a graph of a curve showing the cycle of accumulation and dispersion of aluminum particles onto the reticle, and the subsequent reduction of the quantity of particles precipitating onto the reticles after the machine rollers have been cleaned.
Figure 2:
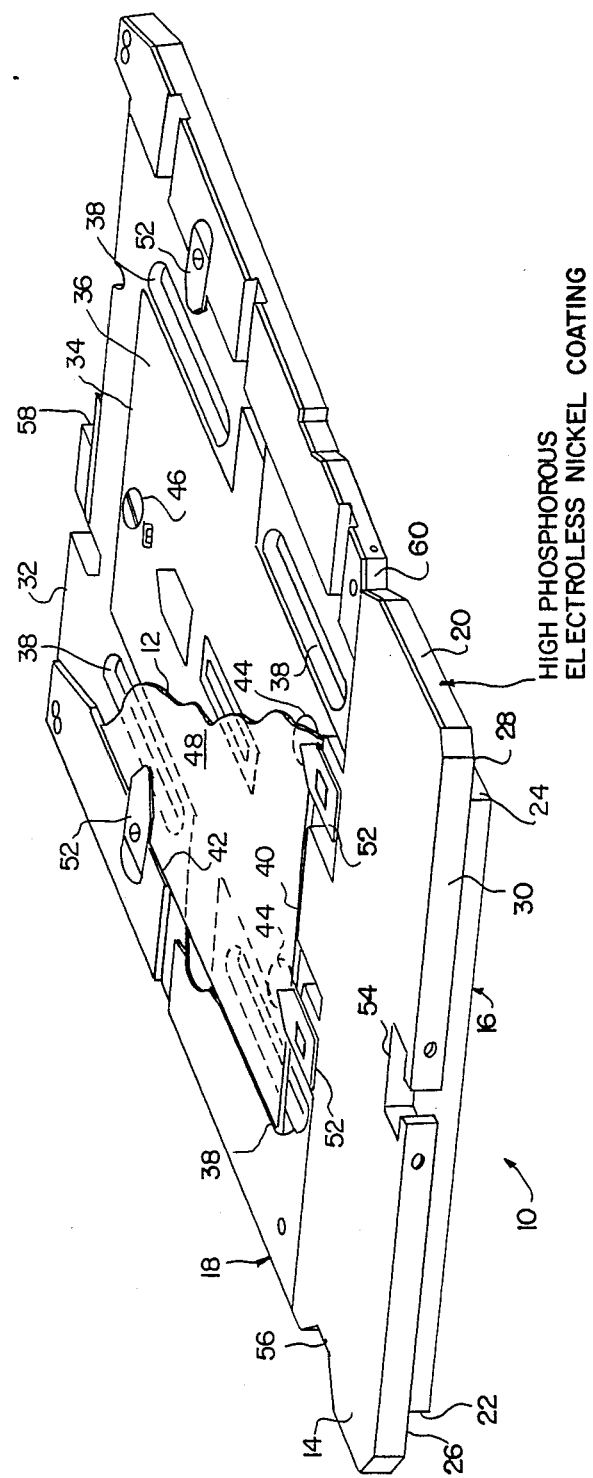
FIG. 2 is a perspective view of a cassette loaded with a (partially cut away) reticle blank and showing some of the cassette surfaces coated and hardened in accordance with the present invention.

A cassette 10 of conventional design for holding a glass reticle 12 so that the cassette and reticle can be loaded into a magazine and load chamber of an E-beam system is shown in FIG. 2 modified in accordance with the present invention. Cassette 10 is generally rectangular, having parallel planar upper and lower principal surfaces 14 and 16, left and right side portions chamferred to form left and right side principal surfaces 18 and 20, left and right side inset secondary surfaces 22 and 24, and lower inset secondary surfaces 26 and 28, and having front and back face surfaces 30 and 32, respectively. The cassette center portion has an opening 34 fitted with a spring-loaded backing plate 36. Four oblong holes 38 surround opening 34.

A reticle blank 12 is loaded into cassette 10 by first lowering backing plate 36 so that oblong holes 38 go down around four nylon skid pads (not shown) until the skid pads protrude through respective holes 38. A glass reticle blank plate 12 is inserted into the back face 32 of cassette 10 and slid forward across the skid pads until the reticle plate abuts the front limit surface 40 of the cassette, and slid sideways to the right until it abuts the left limit surface 42. Then, the loading system releases the spring-loaded backing plate 36 with brass studs 44 and sapphire supports 46 to raise the reticle 12 up off of the skid pads until its top surface 48 contacts four sapphire bearing points 50 (FIG. 7) on the underside of respective clamps 52, to hold the reticle in place as shown in FIG. 2.

As will be further explained below, cassette 10 front face 30 has a T-shaped engagement slot 54 for a loading handle, left side principal surface 18 has a notch 56 for a lateral load wheel, and back face 32 and right side principal surface 20 have V-shaped alignment notches 58 and 60, respectively.

Figure 3:
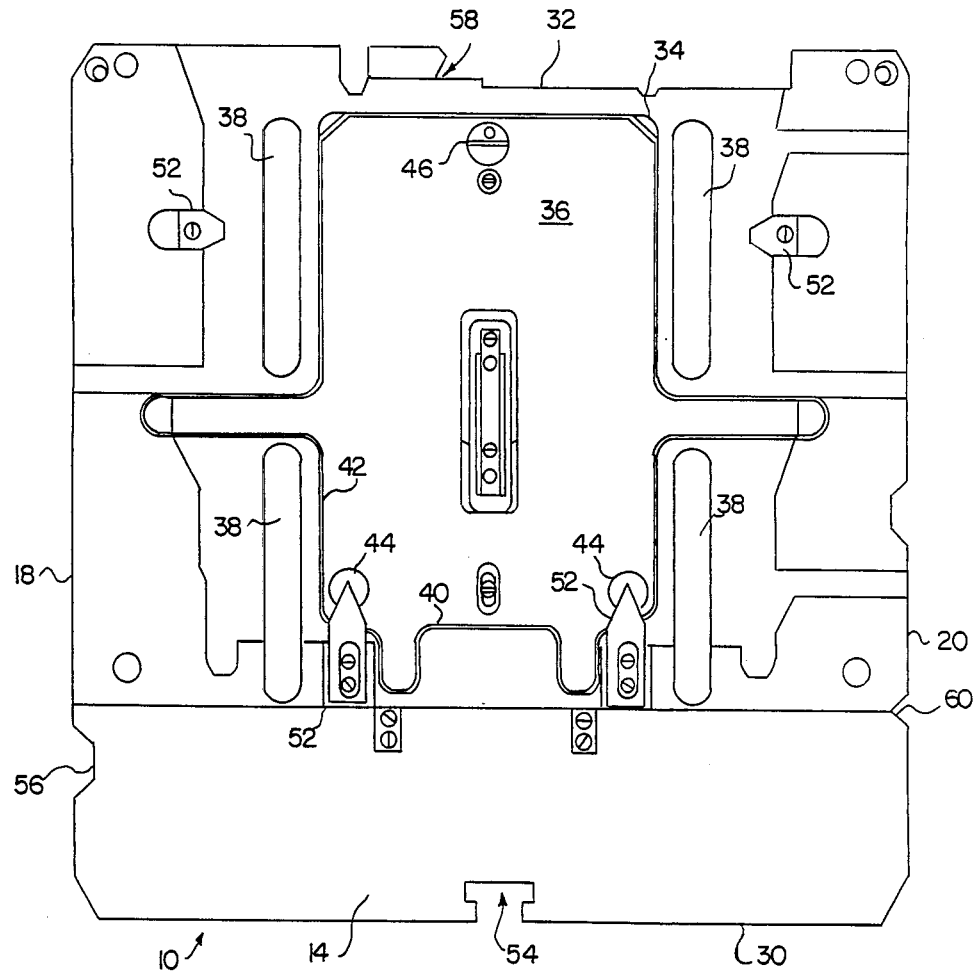
FIG. 3 is a top view of the cassette without a reticle blank loaded.
Figure 4:
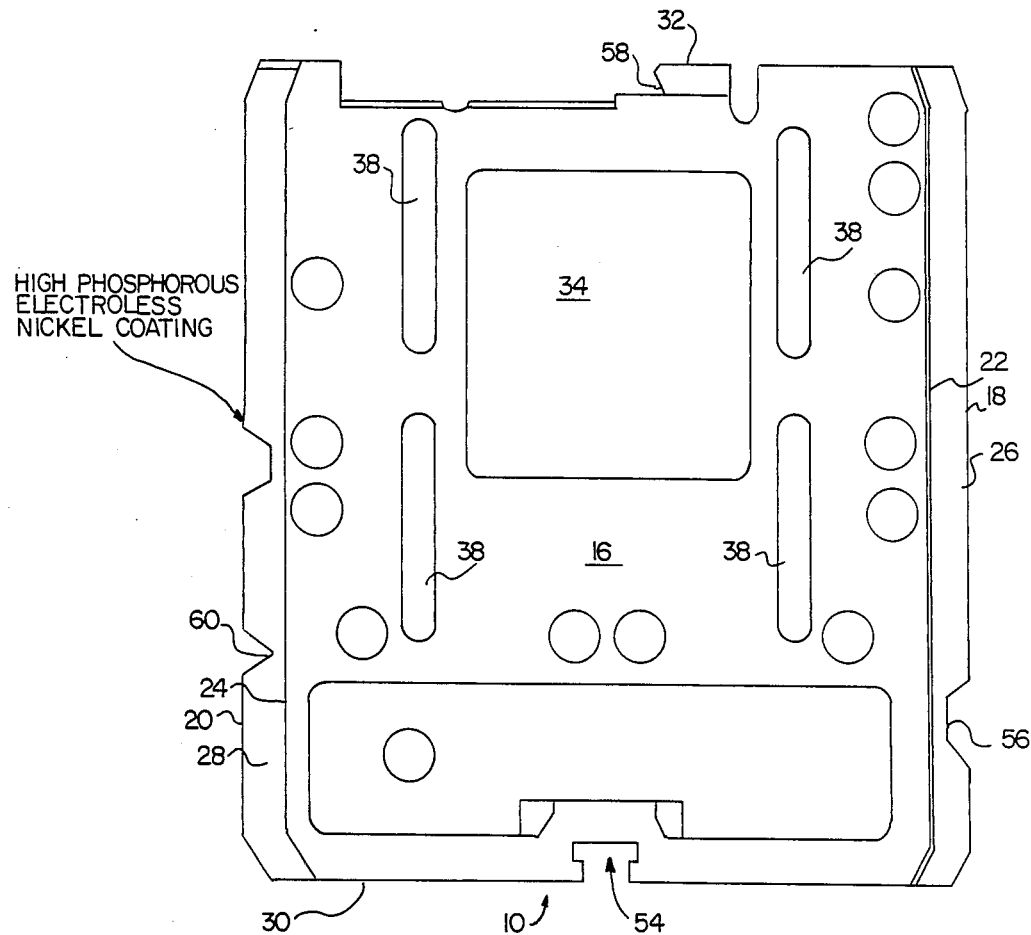
FIG. 4 is a bottom view of the cassette showing lower inset secondary surfaces coated in accordance with the present invention.

FIG. 3 shows the elements of FIG. 2 (omitting the reticle plate) in a top view, and FIG. 4 shows the cassette's lower principal surface 16, left lower inset secondary surface 26, and right lower inset secondary surface 28 in a bottom view.

Figure 5:
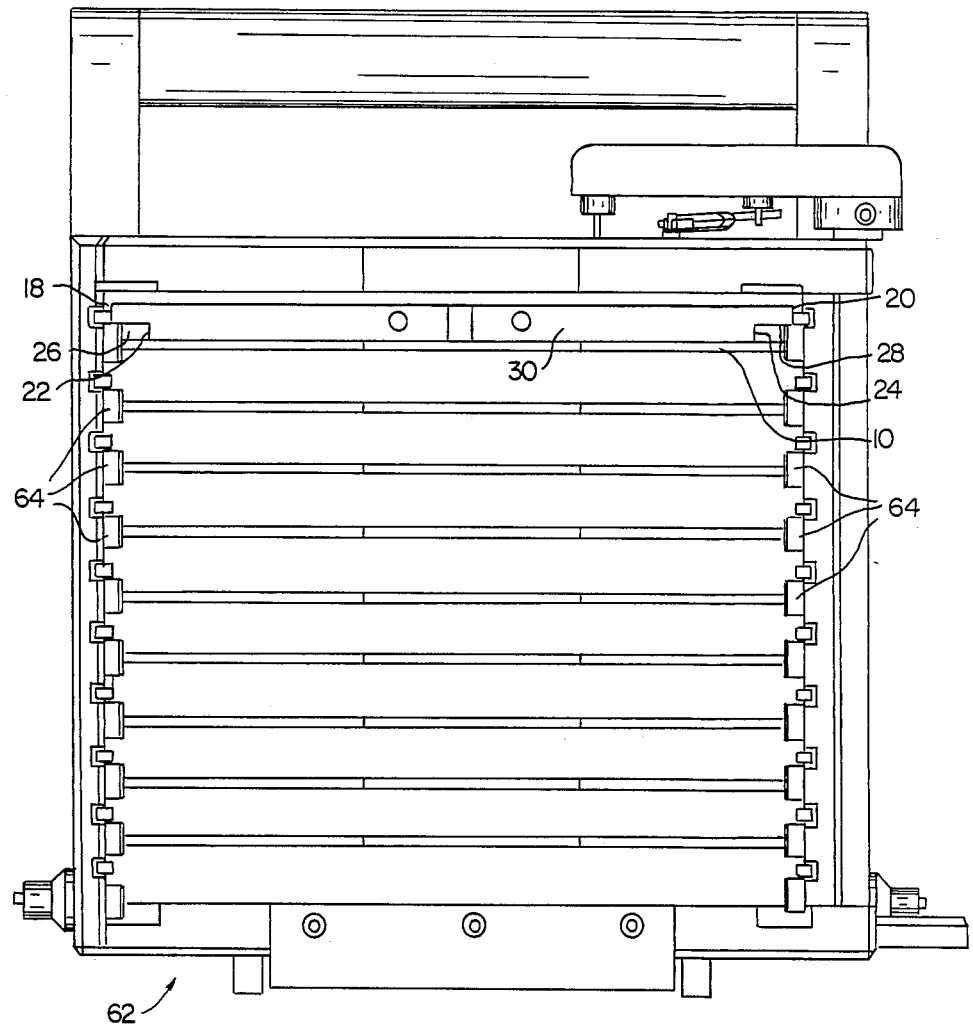
FIG. 5 is a front view of a magazine with one cassette loaded into its upper slot.
Figure 6:
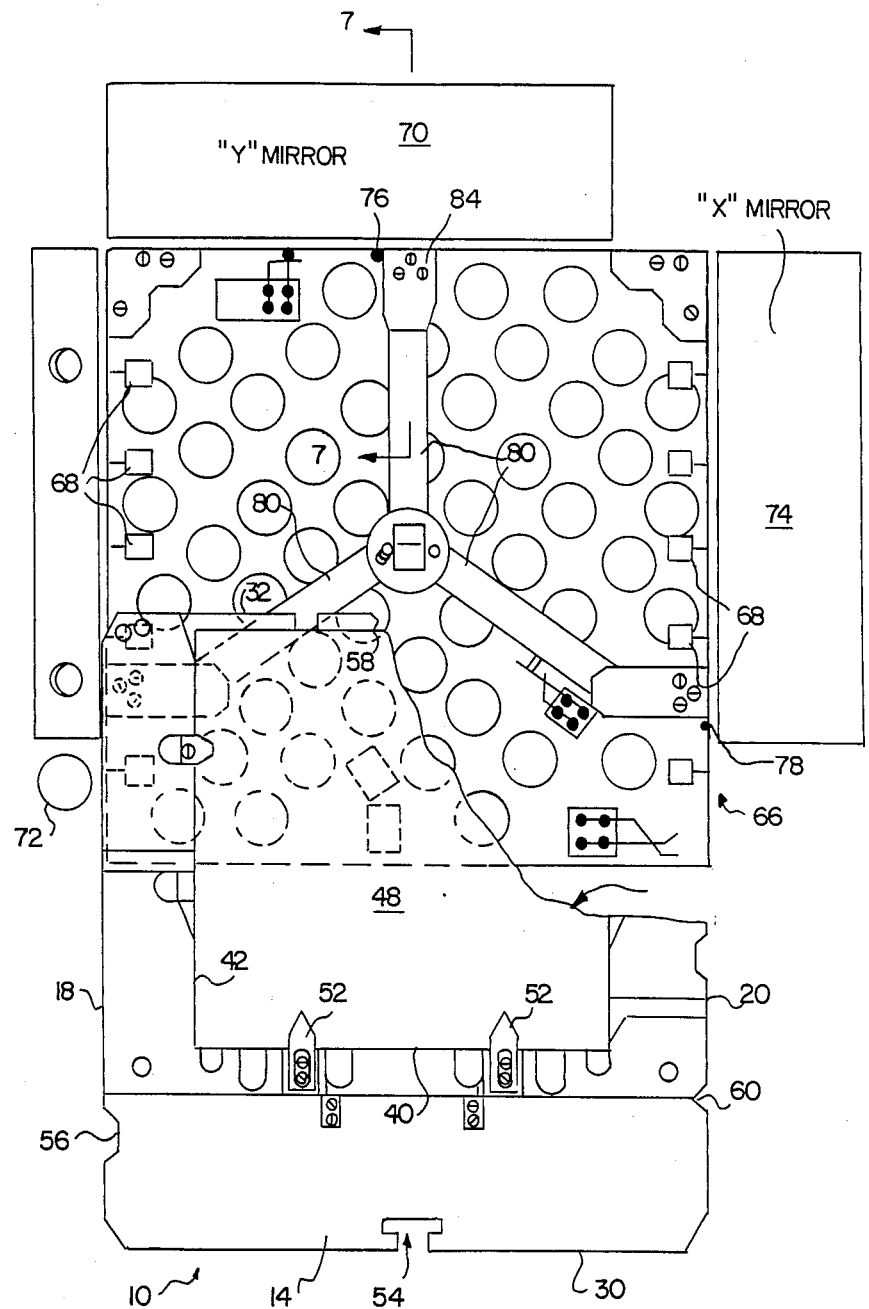
FIG. 6 is a top view of an X-Y stage showing the guide rollers which experience the highest accumulation of aluminum particles and showing a cassette, loaded with a reticle blank, partly rolled onto the stage and partly cut away.
Figure 7:
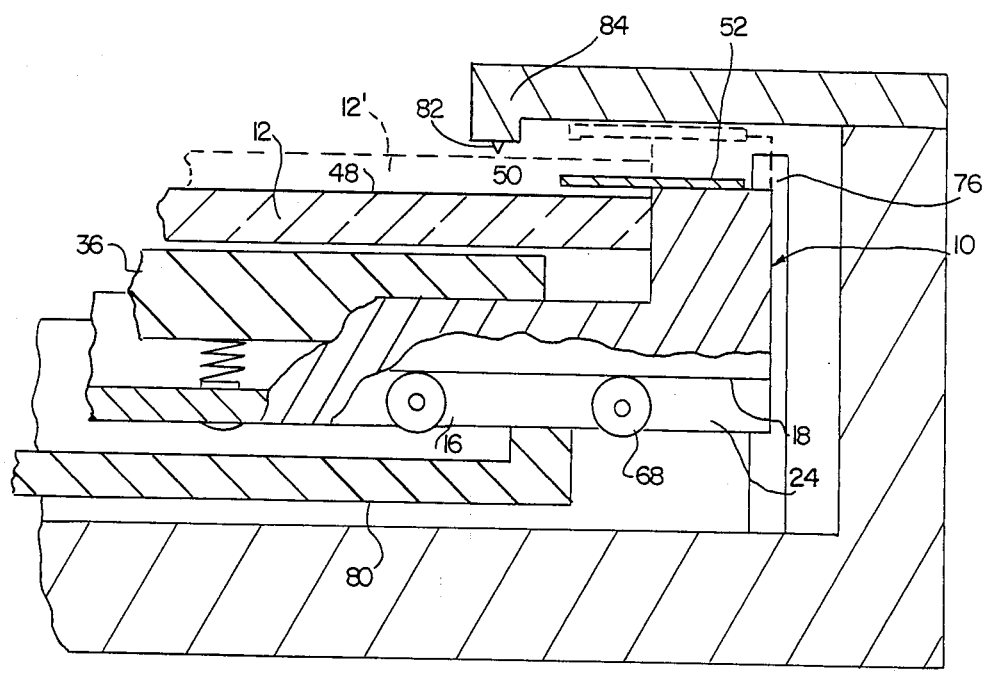
FIG. 7 is a side view of a section taken along the line 7-7 of FIG. 6 and showing portions of the stage, cassette, and reticle.

FIG. 5 shows a magazine 62 having for each cassette 10, on each side, a line of rollers 64, of which only the front roller in each line is visible in FIG. 5. A number (10 for example) of cassettes 10, each loaded with a respective reticle blank 12, are loaded into a cassette magazine 62 which is next installed in the load chamber, not shown, of an E-Beam lithography system. The magazine 62 is then successively shifted vertically to position individual cassettes 10 on the appropriate level to be transferred onto the X-Y stage 66 in the work chamber. Referring to FIG. 6, the work chamber x-Y stage 66 has a line of rollers 68 along each side corresponding to the line of rollers 64 on that side of the magazine 62. A T-shaped handle, not shown, is inserted into T-shaped engagement slot 54 (FIGS. 2, 4 and 6) on the front face 30 of the cassette in the position to be loaded from the magazine 62 into the work chamber. The Tshaped handle pushes the cassette holding the reticle over the magazine rollers 64 onto the stage rollers 68 until the cassette back face 32 abuts the Y axis mirror 70 at the back limit of the stage. Once the cassette has been rolled in to the rear of the stage, a lateral loading wheel 72, FIG. 6, engages notch 56 in the left side principal surface 18 of the cassette, and shifts the cassette sideways to the right until the cassette right side principal surface 20 abuts the X axis mirror 74 at the right limit of the stage. This seats the cassette V-notch alignment surfaces 58 and 60 on the back face 32 and on the right side principal surface 20 of the cassette, respectively, in engagement with respective precision alignment pins 76 and 78 on the stage as shown in FIG. 6. Once cassette 10 is positioned in the X and Y directions on stage 66, the reticle 12 is moved vertically with respect to the cassette by a mechanism as shown in FIG. 7. Beneath the stage, a pneumatic lift (not shown) urges inverted tripod fingers 80 upwards on the lower principal surface 16 of the cassette, which rises until the reticle top surface 48 is stopped by sapphire buttons 82 on the undersides of three brackets 84 fixed to the stage. To ensure that reticle 12 is at the correct Z-axis elevation, tripod fingers 80 continue pressing upward to compress the cassette's spring loaded backing plate 36 so that cassette 10 rises with respect to reticle 12, so that the cassette's four clamps 52 no longer hold the reticle down, and so that the reticle top surface 48 elevation is determined by the stage bracket stops 84 rather than by the stage rollers 68. The positioned reticle 12 is then written upon by the E-Beam as is well known in the art.

The cassette left side principal surface 18, inset secondary surface 22, right side inset secondary surface 24 and principal surface 20, and adjacent left and right lower inset secondary surface areas 26 and 28 create friction in rolling over the magazine rollers 64 (FIG. 5) and work area stage rollers 68 (FIG. 6), which wear off small flakes of aluminum, and contaminate the reticles. The present invention substantially eliminates such cassette wear and consequent particle contamination by providing a hard coating on all engagement surfaces 18, 20, 22, 24, 26, 28 and 54 of the cassette, in addition to the hard coating already conventionally provided on alignment notches 58 and 60. This hard coating is preferably an electroless deposit by chemical reduction of nickel-phosphorus alloy containing 5 to 15 percent phosphorous. Electroless deposits of nickel are evenly distributed with a constant thickness, and have a hardness, lubricity, wear resistance and uniform thickness which allows using a minimum thickness of plating to preserve the close tolerances necessary for reticle cassettes.

The specification has illustrated a preferred embodiment of which modifications and adaptions within the scope of the invention may occur to those skilled in the art. The invention is limited only by the scope of the following claims.

I claim:

1. An improved cassette means for holding a reticle blank in an E-beam lithography system, and including generally parallel planar upper and lower principal surfaces, left and right sides with portions having surfaces for engagement with transport rollers and with alignment devices in said lithography system, a back face with a portion having a surface for engagement against an alignment device, and a front face with a portion having a surface forming a handle engagement slot for engagement with a loading handle, said cassette means being configured to be transferred in the direction parallel to said side portions into a magazine, from the magazine onto a stage, and then off of the stage, on transport rollers disposed in said magazine and in said stage which engage said side portion surfaces, characterized in that:

said side portion surfaces;

said back portion surface; and said front portion surface are coated and hardened with electroless deposits of nickel.

2. An improved cassette means as recited in claim 1 wherein said electroless deposits of nickel are alloyed with 5 to 15 percent of phosphorous.

3. An improved cassette means as recited in claim 1 wherein said side portions are chamfered to form left and right side principal surfaces and inset secondary surfaces, and lower inset secondary surfaces, and wherein said principal and secondary surfaces constitute the side portion surfaces that are coated and hardened.

* * * * *